(12) United States Patent
Marutsuka

(10) Patent No.: US 6,433,481 B1
(45) Date of Patent: Aug. 13, 2002

(54) TRANSPARENT ELECTROMAGNETIC RADIATION SHIELD MATERIAL

(75) Inventor: Toshinori Marutsuka, Tokyo (JP)

(73) Assignee: Nisshinbo Industries, Inc., Tokyo (JP)

( * ) Notice: Subject to any disclaimer, the term of this patent is extended or adjusted under 35 U.S.C. 154(b) by 0 days.

(21) Appl. No.: 09/461,370

(22) Filed: Dec. 15, 1999

(30) Foreign Application Priority Data

Jan. 28, 1999 (JP) .......................................... 11-056009

(51) Int. Cl.[7] ............................ H01J 17/16; H01J 61/30
(52) U.S. Cl. ........................ 313/634; 313/493; 313/479
(58) Field of Search ................................. 313/493, 634, 313/479

(56) References Cited

U.S. PATENT DOCUMENTS

| | | | | |
|---|---|---|---|---|
| 4,795,941 A | * | 1/1989 | Noda | 313/479 |
| 5,676,812 A | * | 10/1997 | Kadokura | 205/50 |
| 6,188,174 B1 | * | 2/2001 | Marutsuka | 313/479 |

FOREIGN PATENT DOCUMENTS

| | | |
|---|---|---|
| JP | 1-315334 | 12/1989 |
| JP | 9-298384 | 11/1997 |
| JP | 10-41682 | 2/1998 |
| JP | 10335883 A | * 12/1998 |
| JP | 11-163587 | 6/1999 |
| WO | 97/32458 | 9/1997 |

OTHER PUBLICATIONS

Patent Abstracts of Japan, 1999(No. 03) Mar. 31, 1999—Abstract of JP10–335883.

Patent Abstracts of Japan, 1999(No. 03) Mar. 31, 1999—Abstract of JP10–341093.

* cited by examiner

Primary Examiner—Michael H. Day
Assistant Examiner—Glenn Zimmerman
(74) Attorney, Agent, or Firm—Wenderoth, Lind & Ponack, LLP

(57) ABSTRACT

A transparent electromagnetic radiation shield material includes a transparent base material, an optional transparent adhesive layer on the transparent base material, and a first black layer, a metallic layer and a second black layer of identical mesh pattern successively laminated in alignment on the transparent base material, directly or via the optional transparent adhesive layer, a portion of the second black layer being removed as required.

2 Claims, 1 Drawing Sheet

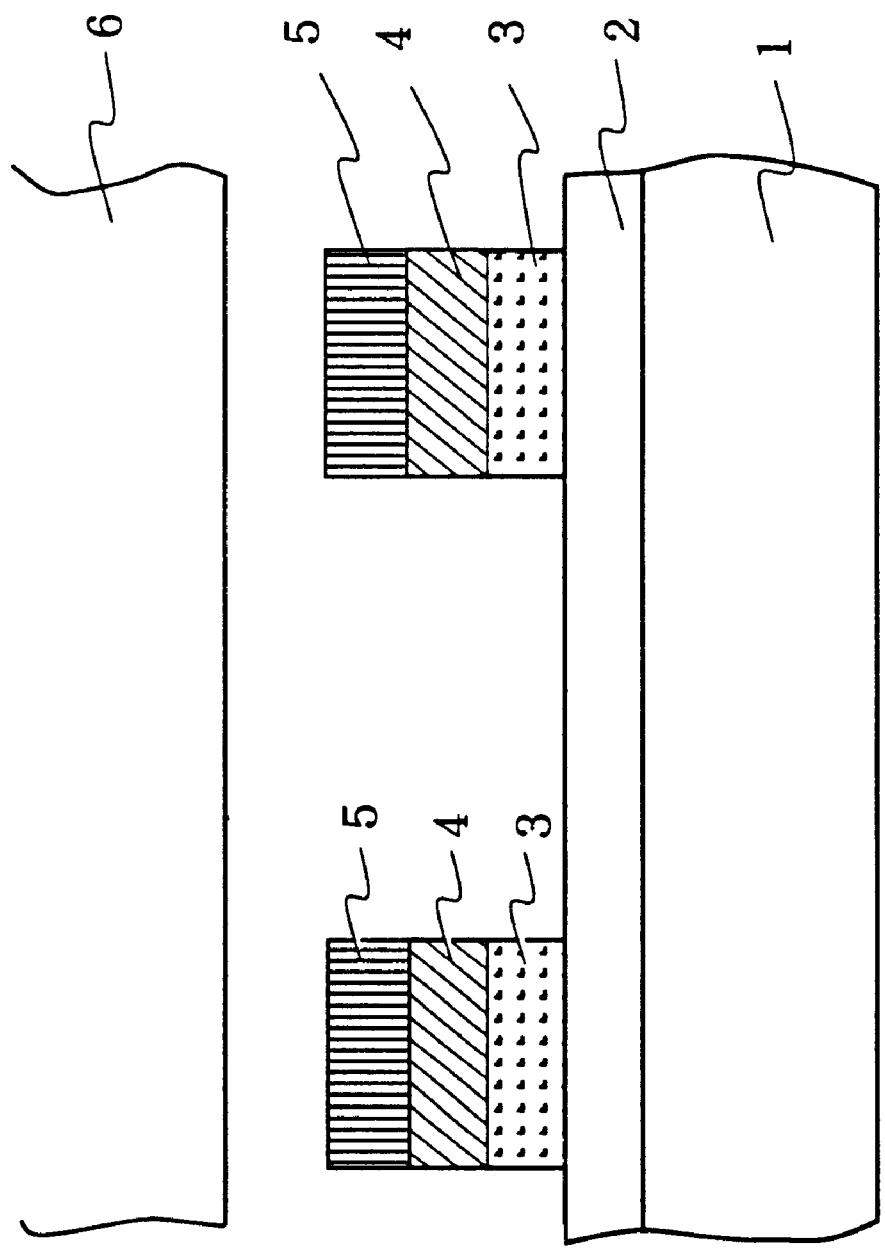

TRANSPARENT ELECTROMAGNETIC RADIATION SHIELD MATERIAL

BACKGROUND OF THE INVENTION

1. Field of the Invention

This invention relates to a transparent electromagnetic radiation shield material for placement in front of a display device or the like to block electromagnetic radiation, and to a method of producing the material. The transparent electromagnetic radiation shield material is particularly suitable for a large plasma display.

2. Description of the Background Art

An electromagnetic radiation shield material for placement in front of a display device or the like is required to have not only excellent electromagnetic radiation shielding capability but also excellent transparency (optical transmittance), good clarity (degree of coating blackness etc.), wide viewing angle and the like. Japanese Patent Application Laid-Open Nos. 9-298384 ('384) and 10-41682 ('682) teach electromagnetic radiation shield materials meeting these requirements to some extent.

Specifically, '384 teaches a method wherein "a step of providing a black dyed layer on a transparent base material, a step of providing a metallic layer on the black dyed layer, a step of providing a patterned resist layer on the metallic layer and a step of removing portions of the metallic layer not covered by the resist layer by etching with an etching solution are conducted in succession, portions of the black dyed layer not covered by the patterned metallic layer being decolored by the etching solution in the etching step."

On the other hand, '682 teaches a method wherein "lines constituting a geometric pattern drawn on the surface of a transparent plastic base material with an electrically conductive material have a line width of 40 $\mu$m or less, a line interval of 200 $\mu$m or greater and a line thickness of 40 $\mu$m or less, part or the whole surface of the base material including the geometric pattern is coated with an adhesive, the difference between the refractive indices of the adhesive coating the geometric pattern and the transparent plastic base material is made 0.14 or less or, if the transparent plastic base material is laminated on an electrically conductive material via an intervening adhesive layer, the difference between the refractive indices of the adhesive layer and adhesive coating the geometric pattern is made 0.14 or less, to obtain an adhesive film having electromagnetic radiation shielding property and transparency, and the result is used as a display electromagnetic radiation shielding component."

When a black dye is used in a black resin layer as in '384, however, it is generally hard to obtain a sufficient degree of coating blackness and good clarity. The dye content and/or the resin layer thickness therefore has to be increased.

In addition, when the etching solution for the metallic layer is used to decolor and extract the black dye, the metallic layer comes to be over-etched owing to the long time needed for the decoloration.

As the electromagnetic radiation shield material is ordinarily used after peeling off the resist layer, moreover, the side facing the display exhibits metallic glare and reflects the display, making it hard to view. Another problem is that the metallic layer readily oxidizes in air. Its conductivity (electromagnetic radiation shielding performance) therefore tends to degenerate (low shielding performance stability).

Japanese Patent Application No. 9-279422 deals with these problems by using a black resin layer containing dispersed black pigment instead of black dye. Although this ensures a high and stable degree of blackness and greatly improves clarity, it does not change the fact that the surface facing the display exhibits metallic glare and spoils viewability, i.e., overall clarity taking presence/absence of reflection into account is still not fully adequate.

On the other hand, '682 is low in electromagnetic wave radiation shielding performance. For patterning in the chemical etching process, moreover, the only black layer usable when the electrically conductive material is copper (foil) is a black metallic layer soluble in the etching solution. Production of this black metallic layer is, however, very time-consuming and costly because it is formed by the wet chemical process widely used for copper (foil) roughening in the ordinary printed circuit board field (commonly called brown processing or black processing because the copper color is changed to brown or black by processing in an aqueous solution or the like of sodium chlorite, sodium hydroxide or trisodium phosphate).

Another problem is that the black metallic layer oxidizes the surface layer of the copper (foil). As this reduces the thickness of the formed metallic copper (foil) by the same amount, it degrades conductivity (electromagnetic wave radiation shielding performance).

In addition, the roughness of the black metallic layer surface makes its etchability extremely bad (formation of patterns with line interval under 200 $\mu$m is difficult) and the surface roughness of the black metallic layer transfers to the adhesive layer at etched portions to make it non-transparent (like frosted glass). As use is impossible without restoring transparency, the adhesive layer is fused and press-bonded (with simultaneous lamination to the base material). This process is conducted at a high temperature of around 110° C., limiting the type of base material to which it can be applied. (It cannot be practically applied to general-purpose acrylic plastic base materials or other such materials with low heat resistance because it causes them to warp markedly.) Further, the side facing the display exhibits metallic glare, so that clarity is poor owing to reflection. Still another shortcoming is that portions of the metallic layer not coated with the adhesive metallic layer readily oxidize in air. Conductivity (electromagnetic radiation shielding performance) therefore tends to degenerate.

BRIEF DESCRIPTION OF THE DRAWING

FIG. 1 is a schematic sectional view showing an embodiment of a transparent electromagnetic radiation shield material according to the present invention and a display to which it is attached.

SUMMARY OF THE INVENTION

The present invention overcomes the aforesaid problem of poor clarity owing to reflection when the side facing the display exhibits metallic glare and the aforesaid problem of the conductivity (electromagnetic wave radiation shielding performance) being degraded by oxidation of the metallic layer during use of the electromagnetic radiation shield material (in air). The present invention is characterized in further laminating a second black layer on the metallic layer.

Specifically, in a first aspect, the present invention provides a transparent electromagnetic radiation shield material comprising a transparent base material, an optional transparent adhesive layer on the transparent base material, and a first black layer, a metallic layer and a second black layer of identical mesh pattern successively laminated in alignment on the transparent base material, directly or via the optional transparent adhesive layer, a portion of the second black layer being removed as required.

In a second aspect, the present invention provides a transparent electromagnetic radiation shield material according to the first aspect, wherein the mesh pattern is a grid pattern of lines of a width of 50 μm or less, interval (opening width) of less than 200 μm and thickness of 50 μm or less.

In a third aspect, the present invention provides a transparent electromagnetic radiation shield material according to the first aspect, wherein the first black layer and the second black layer are black metallic oxide layers.

In a fourth aspect, the present invention provides a method of producing a transparent electromagnetic radiation shield material comprising an optional step of forming an optional transparent adhesive layer on a transparent base material, a step of successively forming on the transparent base material, directly or via the optional transparent adhesive layer, a first black layer selected from among a black resin layer, a black inorganic layer and a black metallic oxide layer, a metallic layer, and a second black layer selected from among a black resin layer, a black inorganic layer and a black metallic oxide layer, a step of providing a mesh-like resist layer on the second black layer, a step of removing portions of the first black layer, metallic layer and second black layer not protected by the resist layer by sand-blasting and/or dissolution with an etching solution to form a mesh pattern corresponding to the mesh-like resist layer, and an optional step of peeling off the resist layer and/or coating the mesh-like pattern side (side opposite the transparent base material) with transparent resin.

In a fifth aspect, the present invention provides a method of producing a transparent electromagnetic radiation shield material according to the fourth aspect, wherein the metallic layer is formed by direct electroplating on the first black layer having a surface resistance of 10Ω or less.

In a sixth aspect, the present invention provides a method of producing a transparent electromagnetic radiation shield material according to the fourth aspect, wherein the black metallic oxide layer is formed by one or a combination of two or more processes selected from among ion plating, sputtering, vacuum deposition, electroless plating and electroplating.

In a seventh aspect, the present invention provides a method of producing a transparent electromagnetic radiation shield material comprising a step of forming resist on a transparent base material in a reverse-mesh pattern, a step of successively forming thereon (on the surface of the transparent base material portion and the resist portion) a first black layer, a metallic layer and a second black layer, and a step of removing only the first black layer, metallic layer and second black layer on the resist portion surface by peeling off the resist (liftoff process).

In an eighth aspect, the present invention provides a method of producing a transparent electromagnetic radiation shield material according to the seventh aspect, wherein the first black layer and the second black layer are black metallic oxide layers.

In a ninth aspect, the present invention provides a method of producing a transparent electromagnetic radiation shield material according to the seventh aspect, wherein the total thickness (line thickness) of the first black layer, metallic layer and second black layer is 5 μm or less.

DETAILED DESCRIPTION OF THE PREFERRED EMBODIMENTS

The base material used in this invention is selected based on intended purpose. It is required to be transparent. It is selected according to intended use from among various materials including, for example, glass plate, plastic film, plastic sheet and plastic plate. The shape of the base material is not particularly limited.

When the transparent base material is a continuous web (roll) of film, sheets of different sizes can be easily cut from the obtained transparent electromagnetic radiation shield film while avoiding inclusion of defective portions. This is advantageous from the points of high yield and economy. Since the roll film can be produced by a continuous process, its productivity is higher than when the transparent base material is plate-like. Owing to its flexibility, moreover, the film can also be used to produce curved shields.

The present invention also enables fabrication of a transparent electromagnetic radiation shield panel by laminating the transparent electromagnetic radiation shield film by its electromagnetic wave shielding layer surface to a display panel or a transparent base plate, using an intervening transparent adhesive.

A plastic used as the base material is preferably a resin with high transparency. Preferable examples include acrylic resins, polycarbonate, polyethylene, AS resins, vinyl acetate resin, polystyrene, polypropylene, polyester, polysulfone, polyethersulfone, polyvinylchloride, olefine-maleimide copolymer, and norbornene resins. Among these, olefine-maleimide copolymer and norbornene resins are particularly preferable owing to their high heat resistance.

The plastic should preferably have a thermal-deformation temperature of 140–360° C., a coefficient of thermal linear expansion of not greater than $6.2 \times 10^{-5}$ cm/cm·° C., a pencil hardness of not less than 2H, a bending strength of 1,200–2,000 kgf/cm$^2$, a modulus of elasticity in bending of 30,000–50,000 kgf/cm$^2$, and a tensile strength of 700–1,200 kgf/cm$^2$. A plastic with these properties is resistant to high-temperature warping and scratching, and can therefore be used in a wide range of environments.

The plastic preferably has an optical transmittance of not less than 90%, an Abbe's number of 50–70 and a photo-elasticity constant (glass region) of an absolute value of not greater than $10 \times 10^{-13}$ cm$^2$/dyne. A plastic with these properties exhibits high transparency (is bright) and little birefringence (is not likely to produce a double image), and therefore does not degrade the image quality, brightness etc. of the display.

The metallic layer sandwiched between the first black layer and the second black layer in this invention is not particularly limited regarding type, color, thickness or method of formation insofar it imparts electromagnetic radiation shielding capability and can be etched. Preferable examples include copper, nickel, iron, stainless steel, titanium, aluminum, gold and silver of a resistivity of $1.0 \times 10^{-4}$ Ω cm or less. Among these, copper is particularly preferable from the points of shielding property (resistivity), etchability and price. In general, the shielding performance of the metallic layer improves with increasing conductivity (smaller specific resistance), the shielding performance thereof improves with increasing thickness, and the etchability thereof improves with increasing thinness.

Good shielding performance and etchability are hard to achieve simultaneously when the resistivity exceeds $1.0 \times 10^{-4}$ Ω cm.

The metallic layer can be formed by one or a combination of two or more of ion plating, sputtering, vacuum deposition, electroless plating and electroplating as appropriate for the required thickness, adhesion and the like. Otherwise a metallic foil can be used. Copper is preferably used in the form of copper foil from the viewpoint of shielding performance and price.

In the case of a copper foil, since the shielding performance does not change substantially at thicknesses of 5 μm and above (thinnest developed product; thinnest commercially available product being 9 μm), one of a thickness of 5–35 μm preferably 9–18 μm, is ordinarily used in consideration of handling ease and cost per unit area (18 μm copper foil currently being cheapest).

The pattern and aperture ratio of the metallic foil are not particularly limited insofar as they are within ranges ensuring sufficient electromagnetic radiation shielding performance and optical transmittance. Even a parallel line pattern, for example, provides shielding effect (exhibiting directionality in the near field). Since the effect is insufficient, however, a mesh pattern is ordinarily used. Various basic mesh patterns are available, including grid (tetragonal), triangular, polygonal, circular and elliptical.

The aperture ratio (the ratio of the non-metallic foil portion area relative to the repeated pattern unit area) is determined by the line width and interval (opening width) of the metallic layer. Different patterns with the same aperture ratio have the same optical transmittance. Since the electromagnetic radiation shielding performance increases with decreasing opening width, however, a narrower opening width is ordinarily preferable.

In the case of a grid, the opening width is preferably 200 μm or less, more preferable 100 μm or less. The opening width can be reduced to any value within the range in which patterning is possible. Therefore, no lower limit is defined. In consideration of the lower limit of the line width, the aperture ratio and the like, however, the opening width is generally around 10 μm at the smallest.

When the opening width is expanded, the shielding performance always decreases if the aperture ratio (optical transmittance) is increased. When the opening width is narrowed, enhanced shielding performance can be achieved simultaneously with an increase in the aperture ratio (optical transmittance).

The line width is preferably 50 μm or less, more preferably 25 μm or less. Setting the opening width and the aperture ratio automatically sets the line width. No particular lower limit is set for the line width. In consideration of patternability and the like, however, the line width is generally around 2 μm at the smallest.

The line thickness is preferably 50 μm or less, more preferably 25 μm or less. In consideration of patternability, viewing angle and the like, the aspect ratio (line thickness/line width) is ordinarily set at 1 or less (because patternability decreases and viewing angle narrows with increasing aspect ratio). No particular lower limit is set for the line thickness. In consideration of shielding performance and the like, however, the line thickness is generally around 1 μm at smallest.

The final values are, however, decided to fall within ranges that do not cause occurrence of Moiré fringes when the transparent electromagnetic radiation shield material is disposed on the front of the display panel.

In the present invention, each black layer is one or a combination of two or more of a black resin layer, a black inorganic layer and a black metallic oxide layer.

The black layers are formed to obtain clarity (viewability), including such aspects of clarity as antireflection property and the like. FIG. 1 shows the transparent base material disposed in front of a display 6. The first black layer visible through the transparent base material must have a high degree of blackness. The second black layer, however, requires only such a degree of blackness as not to exhibit metallic glare and cause reflection. (This will be explained in more detail later.)

When the first black layer is directly electroplated, the conductivity of the first black layer as expressed in surface resistance must be 10Ω or less (explained later). In other cases, only a degree of blackness is required and conductivity is unnecessary (but not a problem if present).

(1) In the case of the black resin layers, the first black resin layer (on the:side nearer the transparent base material) is a resin layer containing black pigment and the second black resin layer (on the side farther from the transparent base material) is a resin layer containing a black pigment and/or a black dye.

Black pigment, which is high in blackness level and stability, is used in the first black resin layer to ensure a sufficient degree of blackness of the black layer. (Black dye cannot be used owing to its low blackness level and stability.)

Either black pigment or black dye can be used for the second black resin layer because it is only required to prevent reflection.

The black pigment used must exhibit black color. It can, for example, be composed of reduced metal particles, metal oxide particles, carbon particles or the like. The reduced metal particles can be colloid particles contained in a reduced metal colloid dispersion or reduced metal powder particles obtained from the metal colloid dispersion. They are not particularly limited as regards type of metal or grain size insofar as they are uniformly dispersible in the coating liquid (coating). To ensure dispersion stability, however, the grain size is preferably 1 μm or less. The reduced metal particles preferably have high stability with respect to the atmosphere and moisture.

Specific examples include colloids containing metals belonging to Group Ib or Group VIII of the Periodic Table of the Elements (Cu, Ni, Co, Rh, Pd etc.), with reduced Ni colloid particles and reduced Ni powder obtained therefrom being particularly preferable. The reduced metal colloid particles can be produced by the methods described in Japanese Patent Application Laid-Open No. 1-315334. Specifically, a colloid dispersion can be obtained by reducing a salt of the metal in a mixed solution consisting of a lower alcohol and an aprotic polar compound.

Like the reduced metal particles, the metal oxide particles are also not particularly limited as regards type of metal or grain size insofar as they are uniformly dispersible in the coating liquid (coating). To ensure dispersion stability, however, their grain size is preferably 1 μm or less. Preferable examples include particles of oxides of metals belonging to Group Ib or Group VIII of the Periodic Table of the Elements such as iron, copper, nickel, cobalt and palladium.

Like the reduced metal particles and the metal oxide particles, the carbon particles are also not particularly limited as regards type or grain size insofar as they are uniformly dispersible in the coating liquid (coating). To ensure good dispersion stability, however, their grain size is preferably 1 μm or less. Preferable examples include carbon black and particles of natural or artificial graphite.

The black dye used is not particularly limited as regards type or content insofar as it is uniformly dispersible or soluble in the coating. When present in the coating, the black pigment is preferably stable against the atmosphere, moisture, light and heat. Specific examples include acid dyes, dispersion dyes, direct dyes, reactive dyes, sulfur dyes, sulfur vat dyes and the like. Among these acid dyes are particularly preferable.

The amount of the black pigment or black dye contained in the black resin layer is preferably 1–80 wt %, more preferably 5–70 wt %. At a content of less than 1 wt %, the degree of blackness of the black layer is low. At a content of greater than 80 wt %, the physical properties of the coating are degraded.

The resin used in the black resin layer can be of any type capable of efficiently dispersing or dissolving the black pigment or black dye in the resin solution (black coating liquid) containing the black pigment or the black dye in dispersion or solution and in the coating (black resin layer) obtained by applying and drying the coating liquid.

The resin can be of any degree of transparency, color and the like insofar as it does not impair the blackness of the black resin layer (the degree of blackness of the black layer).

Specific examples of preferable resins include polyvinyl acetal, acrylic, polyester, cellulose, polyimide and gelatin resins.

The black resin layer referred to here is a black layer whose constituent other than the black pigment or black dye (matrix or binder) is totally resin. Plasticizer, surfactant and other additives can be included to the extent that they do not degrade the physical properties of the black resin layer.

In addition to being black, the first black resin layer is also electrically conductive owing to its high content of black pigment such as conductive carbon particles (soot, carbon black, graphite or the like) and reduced metal colloid particles (or reduced metal powder obtained therefrom). It can therefore be directly electroplated. Because of this, the conductivity of the black resin layer expressed in surface resistance is preferably 10Ω or less, more preferably 5Ω or less. When the surface resistance is greater than 10Ω, the deposition of the plating lacks uniformity.

For this purpose, an ink-like liquid obtained by dispersing carbon particles in a resin solution (carbon content of coating after drying about 90%), a conductive carbon paint, or a resin solution containing dispersed palladium colloid particles or the like can be used to advantage.

In the case of using reduced metal colloid particles, a black resin layer that is capable of being directly electroplated (that is conductive) can also be formed by forming a transparent resin layer and then soaking it in a reduced metal colloid particle dispersion (causing the reduced metal colloid particles to permeate into and adsorb on the transparent resin layer.) When this method is used, the reduced metal colloid particle content of the black resin layer obtained exhibits a gradient in the thickness direction of the resin layer (content greatest at the surface layer). This method is, however, highly effective for obtaining excellent electroplating deposition property and adhesion property.

Although the processing conditions vary depending on the type, concentration and colloid grain diameter of the metal of the reduced metal colloid dispersion, in the case of commercially available standard palladium dispersion (containing about 1% Pd as $PdCl_2$), soaking is conducted for 1–60 min, preferably 5–30 min, at normal room temperature. At less than 1 min the degree of blackness and conductivity are low (plating deposition uneven). When the soaking time exceeds 60 min, little additional increases in the degree of blackness and the conductivity are observed.

Although direct electroplating of a conductive black layer has been practiced in the past, it has been used solely in applications requiring only conductivity (not requiring blackness), such as in the case of printed circuit board through-hole plating and the like.

In this invention, it is used in applications requiring a black layer (blackness), and the fact that the conductive black layer can be directly electroplated is utilized to simplify the production process and reduce cost, which is totally new as a method of producing a transparent electromagnetic radiation shield material. This method is highly effective for producing high-performance transparent electromagnetic radiation shield materials at low cost.

The solvent for preparing the black coating liquid resin solution in this invention can be of any type insofar it can disperse or dissolve the resin and the black pigment or black dye.

Preferable solvents include one or a mixture of two or more of, for example, water, methanol, ethanol, chloroform, methylene chloride, trichloroethylene, tetrachloroethylene, benzene, toluene, xylene, acetone, ethyl acetate, dimethylformamide, dimethylsulfoxide, dimethylacetamide and N-methylpyrrolidone. A solvent appropriate for the combination of resin and black pigment or black dye is selected.

The amount of solvent used is selected so as to obtain an appropriate viscosity and fluidity and to make the solution appropriate for application to the base material.

The solution of the resin and black pigment or black dye (black coating liquid) is applied to the transparent base material or the metallic layer and dried to form a coating (black resin layer) containing the black pigment or black dye. The application of the solution can be carried out by brush coating, spraying, dipping, roller coating, calender coating, spin coating, bar coating, screen printing or other conventional method selected in view of the shape of the transparent base material or metallic layer.

The conditions (temperature, time etc.) for coating formation are determined based on the type and concentration of the resin, the coating thickness and the like. The non-volatile content of the solution is normally 0.05–20 wt %. The thickness of the dried coating is 0.5–50 $\mu$m, preferably 1–25 $\mu$m. No blackness is observed and the clarity is poor at a thickness of less than 0.5 $\mu$m. The viewing angle is narrow at a thickness exceeding 50 $\mu$m.

(2) When the first black layer and the second black layer are formed as black inorganic layers they are both inorganic layers containing black pigment.

The black pigment used is not particularly limited as regards type or grain size insofar as it is uniformly dispersible in the black inorganic layer. To ensure good dispersion stability, however, the grain size is preferably 1 $\mu$m or less. The same black pigments as set out regarding the black resin layer can be used.

The amount of the black pigment contained in the black inorganic layer is preferably 1–50 wt %, more preferably 5–25 wt %. At a content of less than 1 wt %, the degree of blackness of the black layer is low. At a content of greater than 50 wt %, the physical properties of the black layer are degraded.

To form the black inorganic layer, inorganic particles containing black pigment and/or a mixture of black pigment and inorganic particles are made into a liquid or pasty black coating liquid together with a fluid substance, the black coating liquid is applied and dried to form a coating, the coating is heat treated as required, and the particles are bonded by fusion, sintering or use of a binder.

The inorganic particles used are not limited by type, grain size, transparency, color or the like insofar as they can be uniformly dispersed in the liquid or pasty black coating liquid and do not degrade the blackness of the black inorganic layer. To ensure good dispersion stability, however, the grain size is preferably 1 μm or less. Although the inorganic particles are used chiefly for forming the matrix, they are also used to impart viscosity and thixotropy to the black coating liquid.

Preferable inorganic particles include single and multiple component oxides such as silicate glass ($SiO_2$), alkali silicate glass ($Na_2O$-$SiO_2$), soda-lime glass ($NaO$-$CaO$-$SiO_2$), potassium-lime glass ($K_2O$-$CaO$-$SiO_2$), lead glass ($K_2O$-$PbO$-$SiO_2$), barium glass ($BaO$-$B_2O_3$-$SiO_2$), borosilicate glass ($Na_2O$-$B_2O_3$-$SiO_2$), other glasses (main components shown in parentheses), $Al_2O_3$, $TiO_2$, $ZrO_2$, MgO and the like, carbides such as SiC, WC, TiC, TaC, ZrC, $B_4C$ and the like, nitrides such as $Si_3N_4$, BN, TiN, ZrN, AlN and the like, oxynitrides such as sialon and the like. The different types of inorganic particles can be used individually or in combinations. Among them, soda-lime glass is particularly preferable.

The fluid substance can be composed of solvent alone but is ordinarily composed of solvent and binder remaining as a solid component after black inorganic layer formation.

The binder is dissolved resin or dispersed resin particles or inorganic particles in the fluid substance. The inorganic particles for the binder have a lower melting point and smaller content than the inorganic particles for the matrix. The inorganic particles for the binder are not distinguished from the inorganic particles for the matrix in other respects.

On the other hand, the resin used as binder is not particularly limited by type insofar as the black pigment and the inorganic particles can be efficiently dispersed therein in the state of the black coating liquid and the black inorganic layer. The matrix and binder resins set out for the black resin layer can be used. However, to ensure the required physical properties (hardness etc.) and workability of the inorganic layer, the binder resin is used in the black inorganic layer at a content of 10 wt % or less.

The black resin layer has high coating formability (particularly. in the case of a thin film) but is low in patternability by a process such as blasting (the coating is softer than the black inorganic layer). The opposite can be said of the black inorganic layer, which has markedly different properties from the black resin layer. Selection is therefore made between the black resin layer and the black inorganic layer based on the required mesh pattern, line width/line interval (opening width), viewing angle, fabrication precision, fabrication cost and the like.

The solvent used can be of any type insofar it is capable of dispersing or dissolving the black pigment, inorganic particles and binder. The same solvents as set out regarding the black resin layer can be used.

The nonvolatile component concentration of the black coating liquid, the thickness and coating method of the black inorganic layer and the like are the same as in the case of the black resin layer.

The black inorganic layer referred to here is a black layer whose inorganic component accounts for greater than 50 wt % of the components other than black pigment (matrix or binder). Irrespective of the content of components other than the black pigment in the black inorganic layer, when they constitute the "sea" portion of a "sea/island" structure they are referred to as the "matrix," as distinguished from the "binder" in other cases. Plasticizer, surfactant and other additives can be included to the extent that they do not degrade the physical properties of the black inorganic layer.

(3) In the case of a black metallic oxide layer (black metallic oxide being defined to mean not "oxide of black metal" but "black oxide of metal"), as in the case of the black resin layer and the black inorganic layer, the layer is one added to (laminated on) the metallic layer and is not a layer formed by blacking a portion (surface layer) of the metallic layer by oxidation processing.

Any black metallic oxide having sufficient blackness and capable of etching can be used irrespective of type, thickness or forming method.

Preferable examples include oxides of copper, nickel, cobalt, iron, palladium, platinum, indium, tin, titanium, chromium and the like. Such oxides can be used individually or in combinations of two or more. Among them, copper oxide and tin oxide are particularly preferable from the aspects of etching workability and price.

Some metallic oxide layers (mostly ones with electrical insulating property) have low conductivity (e.g., one made of tin oxide etc.). Such metallic oxide layers cannot readily provide good shielding performance and are clearly distinguished from a metallic layer as regards purpose and conductivity.

The thickness of the black metallic oxide layer is preferably 0.01–1 μm, more preferably 0.05–0.5 μm. At less than 0.01 μm, many pinholes occur and blackness is insufficient. At greater than 1 μm, the processing cost is high.

The black metallic oxide layer can be formed by one or a combination of two or more of vacuum deposition, sputtering, ion plating, electroless plating and electroplating.

When the first black layer is laminated on the transparent base material through an intervening transparent adhesive, the transparent adhesive can be selected from among, for example, polyvinylacetal, acrylic, polyester, epoxy, cellulose and vinyl acetate type adhesives. The thickness of the adhesive layer is generally 1 μm or greater, preferably about 5–500 μm.

As viewed from the side of the transparent base material (thickness: 2 mm, refractive index: 1.49, optical transmittance: 93%, average roughness Ra: 40Å) of the laminated article, the first black layer preferably has a degree of blackness, expressed as optical density, of 2.9 or greater (angle of incidence of 7°; assuming no specular component). When the optical density is less than 2.9, clarity of the final transparent electromagnetic radiation shield material is poor owing to the low degree of blackness. (The intensity of metallic glare increases with decreasing optical density.) When the optical density is 2.9 or greater, the degree of blackness is sufficiently high but the clarity by this alone is not adequate. Fully satisfactory clarity is obtained only after the second black layer having an optical density of 2.7 or greater is overlaid. In the laminated product overlaid with the second black layer, clarity as perceived by the naked eye does not improve substantially when the degree of blackness of the first black layer expressed as optical density exceeds 4.0.

Although the three layers (the first black layer, metallic layer and second black layer) stacked on the transparent base material, directly or through an intervening transparent adhesive layer, can be given identical aligned mesh patterns by direct processing with a laser beam or the like after overlaying the third layer (second black layer), ordinarily either (A) blasting and/or etching or (B) liftoff is used for this purpose.

(A) In the case of blasting and/or etching, a mesh-like resist portion is first formed on the second black layer after forming the three stacked layers. The resist portion can be formed by a generally known method such as printing or photolithography.

The second black layer is then formed into a mesh pattern corresponding to the resist portion. The method used for is selected according to the type of black layer. For instance, blasting or the like can be used when the black layer is a black resin layer or black inorganic layer, and etching (dissolution with an etching solution) or the like (for removing non-resist portions) can be used when the black layer is a black metallic layer. The mesh-like second black resin layer can also be formed by (1) directly printing black resist in a mesh pattern or (2) exposing and developing a black photoresist to impart a mesh pattern. The metallic layer is then formed into a mesh corresponding to the resist portion. Etching like that used for the black metallic layer can be used for this.

Next, the first black layer is formed into a mesh pattern corresponding to the resist portion. As in the case of the second black layer, this can be carried out by blasting, etching or the like. When the first black layer is a first black resin layer containing carbon particles and has conductivity (surface resistance) enabling anodic oxidation and the metallic layer is composed of a metal (such as Al) which when subjected to anodic oxidation forms an oxide film at the metal surface layer, the carbon particles in the first black resin layer are made brittle by the anodic oxidation and fall off (accompanied by the resin). Anodic oxidation is therefore effective as a method for removing the first black resin layer at the non-resist portions.

Finally, the resist portion is removed by, for example, soaking in an exfoliating solution such as an aqueous alkali solution.

When the first black layer is processed by blasting, the surface of the transparent base material or the transparent adhesive layer at the non-resist portions is roughened (whitened) and is therefore preferably coated with a transparent resin to restore transparency.

The blasting and etching conditions are not particularly defined but can be chosen as appropriate for the type of black layer and metallic layer.

(B) In the case of liftoff, resist is formed on the transparent base material in a reverse-mesh pattern before forming the three stacked layers. Then, after the three layers have been overlaid on the transparent base material and the resist, the resist (with the three layers thereon) is peeled off to leave three mesh-like layers on the transparent base material. The method and conditions of forming the resist pattern portion and the peeling method and conditions are the same as those in the case of blasting and/or etching.

By liftoff, the formation of the three layers into a mesh pattern can be achieved merely by peeling off the resist of reverse-mesh pattern (with the three layers thereon), with no need for blasting, etching or other such processing. The resulting marked reduction in the number of processing steps ensures higher processing precision and yield than in the case of the method utilizing blasting and/or etching.

To facilitate peeling/removal of the resist (with the three layers thereon), the thickness of the three layers should preferably be 5 $\mu$m or less, more preferably 3 $\mu$m or less. When their thickness exceeds 5 $\mu$m, portions of the three layers at non-resist portions of the transparent base material may also peel (poor processability). The minimum thickness need not be limited from the processing aspect (processability improves with increasing thinness) but is determined by the required shielding performance. To achieve a thickness of 5 $\mu$m or less, the first and second black layer should preferably be black metallic oxide layers because sufficient degree of blackness can be secured with such layers even when thin. Black metallic oxide layers are ordinarily deposited by a dry method such as ion plating, sputtering or vacuum deposition, but can also be formed by a wet method such as electroless plating or electroplating.

In this way there is fabricated a transparent electromagnetic radiation shield material having a mesh pattern of a metallic layer sandwiched between black layers (the metallic layer being exposed at a grounding portion for connection of an earth lead). Provision of the grounding portion is required when the shield material is installed on a display or the like. It can be provided by using a commonly known method (blasting etc.) to remove a portion of the second black layer (usually at the frame portion) to expose the metallic layer (conductive portion)

The transparent electromagnetic radiation shield material preferably has an optical transmittance of 65% or greater and a shielding performance of not less than 40 dB in the range of 30 to 1000 MHz (50 dB or greater at 500 MHz). An optical transmittance of less than 65% is too dark and a shielding performance of less than 40 dB (30–1000 MHz) is not sufficient for practical applications.

When the foregoing production methods are applied to a transparent film to fabricate a transparent electromagnetic radiation shield film, the transparent electromagnetic radiation shield film is thereafter laminated to a display panel or a transparent base plate, using an intervening transparent adhesive if necessary, to fabricate a transparent electromagnetic radiation shield panel. The transparent film is preferably one constituted as a continuous web that can be continuously processed into a roll. Such films include plastic films having a thickness in the approximate range of 5–300 $\mu$m made of polyethylene terephthalate (PET), polyimide (PI), polyethersulfone (PES), polyether-etherketone (PEEK), polycarbonate (PC), polypropylene (PP), polyamide, acrylic resin, cellulose propionate (CP), and cellulose acetate (CA).

An example of a transparent electromagnetic radiation shield material provided by the invention will now be explained with reference to FIG. 1. In the illustrated example, the first black layer is a first black resin layer containing dispersed black pigment, the metallic layer is a metallic foil layer, and the second black layer is a second black resin layer containing dispersed or dissolved black pigment or black dye.

FIG. 1 shows the sectional structure of the shield material. The first black resin layer 3 and the second black resin layer 5 are disposed to oppose each other with the metallic foil layer 4 sandwiched therebetween in a unitary, aligned mesh pattern.

The transparent base material 1 and the first black resin layer 3 are attached through a transparent adhesive 2. The transparent base material 1 and the first black resin layer 3 can instead be directly adhered without use of an adhesive. This can be achieved, for example, by rolling, spraying or otherwise applying molten or dissolved black resin on the transparent base material 1 and then drying the applied coating.

The invention will now be explained more specifically with reference to working examples.

EXAMPLE 1

A black coating liquid was prepared by uniformly dispersing black pigment (iron oxide fine powder; Tetsuguro P0023, product of Daido Chemical Industry Co., Ltd.) in an alcohol (ethanol) solution of polyvinylbutyral (PVB) (#6000-C, product of Denki Kagaku Kogyo, Co., Ltd.). (Coating solution composition (parts by weight): iron oxide/PVB/ethanol=50/100/1850.)

The coating liquid was applied to one surface of 12 μm electrolytic copper foil (CF T9 SV, product of Fukuda Metal Foil and Powder Co., Ltd.) and dried to obtain a first black resin layer (10 μm). The coated surface was laminated to a polyethylene terephthalate (PET) film (Lumirror, product of Toray Industries, Inc.) using an acrylic adhesive to obtain a laminated article.

A black photoresist (NPR-60/5CER, product of Nippon Polytech Corp.) was applied to the copper foil side of the laminated article as resist for processing the first black layer and the metallic layer (iron oxide, 13% in dried coating), followed by prebaking, exposure, development and postbakinq to form a resist pattern (second black resin layer; thickness, 20 μm; grid pattern; line width, 20 μm; line interval, 180 μm).

The black resist-patterned article was soaked in etching solution (aqueous solution of 20% ferric chloride and 1.75% hydrochloric acid) to dissolve and remove the copper foil layer at the non-resist portions, the first black resin layer was removed by sand blasting, and an acrylic resin paint was applied and dried to afford a transparent electromagnetic radiation shield material (having the same patterning, line width and line interval as the resist).

The electromagnetic radiation shield material exhibited shielding performance of 65 dB (500 MHz) and transparency (optical transmittance) of 75%. The degree of blacknesses of the first black layer and the second black layer were high, so that the shield material exhibited excellent clarity with no reflection from the side facing the display.

EXAMPLE 2

The second black layer of Example 1 was formed not as a black resist pattern (second black resin layer) but as a soda-lime glass inorganic layer containing dispersed iron oxide fine powder (second black inorganic layer, 10 μm) and further with a resist pattern (thickness: 10 μm) and the second black inorganic layer was thereafter processed (patterned) by sand blasting.

Next, as in Example 1, the metallic layer and the first black resin layer were processed (patterned) by etching and sand blasting to fabricate a transparent electromagnetic radiation shield material. This electromagnetic radiation shield material exhibited the same excellent performances as that obtained in the Example 1.

EXAMPLE 3

The second black layer of Example 1 was formed not with the black resist pattern (second black resin layer) but with a copper oxide layer (second black metallic oxide layer) and further with a resist pattern and the second black metallic oxide layer and the metallic layer were thereafter processed (patterned) by etching.

Next, as in Example 1, the first black resin layer was processed (patterned) by sand blasting to fabricate a transparent electromagnetic radiation shield material. This electromagnetic radiation shield material exhibited the same excellent performances as the that obtained in Example 1.

EXAMPLES 4–6

The first black layers of Examples 1–3 were formed not as resin layers containing black pigment (first black resin layers) but as soda-lime glass inorganic layers containing iron oxide fine powder (first black inorganic layers).

Other aspects of the fabrication (patterning) were conducted in the same manner as in Examples 1–3. The transparent electromagnetic radiation shield materials obtained exhibited the same excellent performances as those obtained in Example 1.

EXAMPLES 7–9

The first black layers of Examples 1–3 were formed not as resin layers containing black pigment (first black resin layers) but as copper oxide layers (first black metallic oxide layers). Further, the processing (patterning) used for the first black layer of Examples 1–6 (first black resin layer or first black inorganic layer) was adopted but etching was utilized in place of sand blasting. The transparent electromagnetic radiation shield materials obtained exhibited the same excellent performances as those obtained in Example 1.

The combinations of first black layer, metallic layer and second black layer in Examples 4–9 are shown in Table 1.

EXAMPLE 10

A transparent electromagnetic radiation shield material was fabricated whose second black layer was formed by replacing black pigment (iron oxide fine powder) contained in the second black resin layer of Example 1 with black dye (metal-containing acid dye).

In clarity, this electromagnetic radiation shield material rated "good," somewhat inferior to the "very good" rating of the electromagnetic radiation shield material of Example 1, but the other performances were substantially the same as those obtained in Example 1.

EXAMPLE 11

A transparent electromagnetic radiation shield material was fabricated whose metallic layer was formed by replacing the copper foil (12 μm) of Example 1 with aluminum foil (15 μm).

In shielding performance, this electromagnetic radiation shield material rated "good," somewhat inferior to the "very good" rating of the electromagnetic radiation shield material of Example 1, but the other performances were substantially the same as those in Example 1. The transparent electromagnetic radiation shield material of this example is advantageous in terms of light weight and low cost.

EXAMPLE 12

A transparent electromagnetic radiation shield material was fabricated in the manner of Example 1 except that an polymethylmethacrylate resin (PMMA) plate was used in place of the PET film. The electromagnetic radiation shield material exhibited the same excellent performances as that obtained in Example 1.

EXAMPLE 13

A transparent electromagnetic radiation shield material was fabricated by using ion plating (IP) to form on a polycarbonate film, in sequence, IP copper oxide (first black metallic oxide layer, 0.5 μm), IP copper (metallic layer, 2 μm) and IP copper oxide (second black metallic oxide layer, 0.5 μm)., forming a resist pattern, and processing (patterning) all three layers at one time by etching.

In shielding performance, this electromagnetic radiation shield material rated "good," somewhat inferior to the "very good" rating of the electromagnetic radiation shield material of Example 1, but the other performances were substantially the same as those obtained in Example 1. The method of this example enables high-yield fabrication of electromagnetic radiation shield materials with high pattern resolution and degree of finish.

EXAMPLE 14

A transparent electromagnetic radiation shield material was fabricated whose metallic layer was formed by replacing the copper foil (12 $\mu$m) of Example 1 with electroless copper (metallic layer, 2 $\mu$m) provided by electroless copper plating. (After the first black resin layer had been formed on one side of the PET film, it was imparted with a plating catalyst and the electroless copper was then formed thereon by electroless copper plating.)

In shielding performance, this electromagnetic radiation shield material rated "good," somewhat inferior to the "very good" rating of the electromagnetic radiation shield material of Example 1, but the other performances were substantially the same as those in Example 1.

EXAMPLE 15

The first black layer of Example 1 was formed not as a black resin layer containing dispersed iron oxide fine powder but as a conductive black resin layer (first black resin layer) by (1) applying and drying a conductive paint containing carbon (mainly graphite) particles dispersed in a resin solution (Everyohm 101S, product of Nippon Graphite Industries Ltd.) or (2) forming a coating of clear resin [polyvinylbutyral (PVB) (#6000-C, product of Denki Kagaku Kogyo, Co., Ltd.], blackening the coating by immersing the coating (for 30 min at normal room temperature) in a black reduced palladium (Pd) colloid dispersion liquid (OPC-80 Catalyst M, product of Okuno Chemical Industries Co., Ltd.), and further effecting conductor-conversion treatment (by immersion for 15 min at normal room temperature in a mixed aqueous solution of Selector A and Selector B, products of Okuno chemical Industries Co., Ltd.) and, if necessary, drying. The metallic layer was formed by replacing the copper foil (12 $\mu$m) with electroplated copper (metallic layer, 2 $\mu$m) formed by direct electroplating, thereby fabricating transparent electromagnetic radiation shield materials.

In shielding performance, these electromagnetic radiation shield materials rated "good," somewhat inferior to the "very good" rating of the electromagnetic radiation shield material of Example 1, but the other performances were substantially the same as those in Example 1.

In the case of (2), a similar electromagnetic radiation shield material can be fabricated by extracting and removing only the black component (Pd colloid particles) from the first black resin layer by use of an etching solution or the like (to make only the extracted and removed portion transparent).

EXAMPLES 16 & 17

Transparent electromagnetic radiation shield materials were fabricated in the manner of Example 13, with the aperture ratio of the grid pattern (line width, 20 $\mu$m; line interval, 180 $\mu$m; aperture ratio, 81%) left unchanged but with the line width and line interval narrowed to ½ (Example 16) and ¼ (Example 17).

With these electromagnetic radiation shield materials (Examples 13, 16 and 17), shielding performance tended to increase with narrower line interval (opening width).

EXAMPLE 18

A transparent electromagnetic radiation shield material (line width, 3 $\mu$m; line interval, 45 $\mu$m; aperture ratio, 87%) was fabricated by increasing the aperture ratio and narrowing the line interval and width of the grid pattern of Example 13.

This electromagnetic radiation shield material was superior to that of Example 13 in transparency (optical transmittance) and shielding performance.

EXAMPLE 19

In order to fabricate a transparent electromagnetic radiation shield material like that of Example 13 using the liftoff process, resist was formed on the film in a reverse-mesh pattern, the three layers were laminated in the manner of Example 13, the result was immersed in a defoliating solution, and the resist (with the three layers thereon) was removed by peeling.

This electromagnetic radiation shield material was superior to that of Example 13 in degree of finish (processing precision). Its other performances were the same as that of Example 13. As the method of this example involves many fewer processing steps and achieves higher yield that of Example 13, it can provide a low-cost product.

Comparative Example 1

A transparent electromagnetic radiation shield material was fabricated in the manner of Example 1 except that the second black resin layer was omitted. The electromagnetic radiation shield material exhibited metallic glare on the side facing the display and a little reflection could be observed. The clarity was therefore inferior to that obtained in Example 1.

Comparative Example 2

A transparent electromagnetic radiation shield material was fabricated in the manner of Example 1 except that the black pigment (iron oxide fine powder) contained in the first black resin layer was replaced with black dye (metal-containing acid dye). Not only were the problems encountered in Comparative Example 1 again observed but the degree of blackness of the first black resin layer was also inferior to that of Comparative Example 1. The clarity was therefore markedly inferior to that obtained in Example 1.

Comparative Example 3

A transparent electromagnetic radiation shield material was fabricated in the manner of Example 13, with the aperture ratio of the grid pattern left unchanged but with the line width and line interval doubled (line width, 40 $\mu$m; line interval, 360 $\mu$m; aperture ratio, 81%). The shielding performance was markedly inferior to that obtained in Example 13.

Comparative Examples 4 & 5

Transparent electromagnetic radiation shield materials were fabricated in the manner of Example 1, with the aperture ratio of the grid pattern left unchanged but with the line width and line interval doubled (Comparative Example 4) and expanded 20 times (Comparative Example 5). With these shield materials (Example 1, Comparative Examples 4 and 5), shielding performance tended to diminish with wider line interval (opening width).

TABLE 1-1

| Example | Transparent base material | First black layer | Metallic layer | Second black layer | Line width (μm) | Line interval (μm) | Aperture ratio (%) | Transparency[1] | Black layer degree of blackness[2] #1 | #2 | Clarity[3] | Shielding performance[4] | Remark |
|---|---|---|---|---|---|---|---|---|---|---|---|---|---|
| 1 | PET film | First black resin layer Iron oxide/PVB | Copper foil 12 μm | Second black resin layer Iron oxide/PVB | 20 | 180 | 81 | ○ | ○ | ○ | ◎ | ◎ | |
| 2 | " | First black resin layer Iron oxide/PVB | Copper foil 12 μm | Second black inorganic layer Iron oxide/Glass | " | " | " | " | " | " | " | " | Compared with Exp 1 |
| 3 | " | First black resin layer Iron oxide/PVB | Copper foil 12 μm | Second black metallic oxide layer Copper oxide | " | " | " | " | " | " | " | " | Compared with Exp 1 |
| 4 | " | First black inorganic layer Iron oxide/Glass | Copper foil 12 μm | Second black resin layer Iron oxide/PVB | " | " | " | " | " | " | " | " | Compared with Exp 1 |
| 5 | " | First black inorganic layer Iron oxide/Glass | Copper foil 12 μm | Second black inorganic layer Iron oxide/Glass | " | " | " | " | " | " | " | " | Compared with Exp 1 |
| 6 | " | First black inorganic layer Iron oxide/Glass | Copper foil 12 μm | Second black metallic oxide layer Copper oxide | " | " | " | " | " | " | " | " | Compared with Exp 1 |
| 7 | " | First black metallic oxide layer Copper oxide | Copper foil 12 μm | Second black resin layer Iron oxide/PVB | " | " | " | " | " | " | " | " | Compared with Exp 1 |

TABLE 1-2

| Example | Transparent base material | First black layer | Metallic layer | Second black layer | Line width (μm) | Line interval (μm) | Aperture ratio (%) | Transparency[1] | Black layer degree of blackness[2] #1 | #2 | Clarity[3] | Shielding performance[4] | Remark |
|---|---|---|---|---|---|---|---|---|---|---|---|---|---|
| 8 | PET film | First black metallic oxide layer Copper oxide | Copper foil 12 μm | Second black inorganic layer Iron oxide/Glass | 20 | 180 | 81 | ○ | ○ | ○ | ◎ | ◎ | Compared with Exp 1 |
| 9 | " | First black metallic oxide layer Copper oxide | Copper foil 12 μm | Second black metallic oxide layer Copper oxide | " | " | " | " | " | " | " | " | Compared with Exp 1 |
| 10 | " | First black resin layer Iron oxide/PVB | Copper foil 12 μm | Second black resin layer metal-containing acid dye | " | " | " | " | " | " | Δ | ○ | " | Compared with Exp 1 |
| 11 | " | First black resin layer Iron oxide/PVB | Aluminum foil | Second black resin layer Iron oxide/PVB | " | " | " | " | " | " | ○ | ◎ | ○ | Compared with Exp 1 |
| 12 | Acrylic resin plate | First black resin layer Iron oxide/PVB | Copper foil 12 μm | Second black resin layer Iron oxide/PVB | " | " | " | " | " | " | " | " | ○ | Compared with Exp 1 |
| 13 | PC film | First black metallic oxide layer IP copper oxide | IP copper 2 μm | Second black metallic oxide layer IP copper | " | " | " | " | " | " | " | " | ○ | Compared with Exp 1 |
| 14 | PET film | First black resin layer Iron oxide/PVB | Electroless copper | Second black resin layer Iron oxide/PVB | " | " | " | " | " | " | " | " | " | Compared with Exp 1 |

TABLE 1-3

| Example | Transparent base material | First black layer | Metallic layer | Second black layer | Line width (μm) | Line interval (μm) | Aperture ratio (%) | Transparency[1] | Black layer degree of blackness[2] #1 | Black layer degree of blackness[2] #2 | Clarity[3] | Shielding performance[4] | Remark |
|---|---|---|---|---|---|---|---|---|---|---|---|---|---|
| 15 | PET film | First black resin layer Carbon or Pd/Resin | Electro-plated copper | Second black resin layer Iron oxide/PVB | 20 | 180 | 81 | ○ | ○ | ○ | ⊙ | ○ | Compared with Exp 1 |
| 16 | PC film | First black metallic oxide layer IP copper oxide | IP copper 2 μm | Second black metallic oxide layer IP copper oxide | 10 | 90 | " | " | " | " | " | ○ to ⊙ | Compared with Exp 13 |
| 17 | PC film | First black metallic oxide layer IP copper oxide | IP copper 2 μm | Second black metallic oxide layer IP copper oxide | 5 | 45 | " | " | " | " | " | ⊙ | Compared with Exp 13 |
| 18 | PC film | First black metallic oxide layer IP copper oxide | IP copper 2 μm | Second black metallic oxide layer IP copper oxide | 3 | " | 87 | ⊙ | " | " | " | ○ to ⊙ | Compared with Exp 13 |
| 19 | PC film | First black metallic oxide layer IP copper oxide | IP copper 2 μm | Second black metallic oxide layer IP copper oxide | 20 | 180 | 81 | ○ | " | " | " | ○ | Higher processability than Exp 13 |

TABLE 1-4

| Comparative example | Transparent base material | First black layer | Metallic layer | Second black layer | Line width (μm) | Line interval (μm) | Aperture ratio (%) | Transparency[1] | Black layer degree of blackness[2] #1 | Black layer degree of blackness[2] #2 | Clarity[3] | Shielding performance[4] | Remark |
|---|---|---|---|---|---|---|---|---|---|---|---|---|---|
| 1 | PET film | First black resin layer Iron oxide/PVB | Copper Foil 12 μm | None | 20 | 180 | 81 | ○ | ○ | X[A] | Δ To ○ | ⊙ | Compared with Exp 1 |
| 2 | " | First black resin layer Metal-containing acid dye | Copper | " | " | " | " | " | Δ | " | Δ | " | Compared with Exp 1 |
| 3 | PC film | First black metallic oxide layer IP copper oxide | IP copper 2 μm | Second black metallic oxide layer IP copper oxide | 40 | 360 | " | " | ○ | ○ | ⊙ | x to Δ | Compared with Exp 13 |
| 4 | PET film | First black resin layer Iron oxide/PVB | Copper foil 12 μm | Second black resin layer Iron oxide/PVB | " | " | " | " | " | " | " | Δ to ⊙ | Compared with Exp 1 & Comp Exp 3 |
| 5 | " | First black resin layer Iron oxide/PVB | Copper foil 12 μm | Second black resin layer Iron oxide/PVB | 400 | 3600 | " | " | " | " | " | X | Compared with Exp 1 & Comp. Exp 4 |

[A] Copper glare

Remarks:

1) Transmittance (%) at wavelength 550 nm measured by spectroanalyzer (UV-240, product of Shimadzu Corp.

⊙: ≧80%
○: <80%–≧65%
Δ: <65%–≧50%
X: <50%

2) Optical density (angle of incidence of 7°; assuming no specular component) measured by spectrophotometric calorimeter (CMS-35SP), product of Murakami Color Research Laboratory, Ltd.

⊙: ≧2.9
Δ: <2.9–≧2.7
X: <2.7

3) An overall evaluation was made based on such factors as degree of blackness and reflection when the shield material was actually placed in front of a display (with the second black layer facing the display). The results were rated as follows:

Very good(⊙)

Very high degree of blackness of first black layer and second black layer and absolutely no annoyance from reflection Good (○)
  Very high degree of blackness of first black layer and substantially no annoyance from reflection despite slightly low degree of blackness of second black layer Fair (Δ)
  Very high degree of blackness of first black layer and slight annoyance from reflection owing fairly low degree of blackness of second black layer Poor (X)
  Fairly low degree of blackness of first black layer and second black layer and considerable annoyance from reflection 4) Electric field shielding performance (dB) at 500 MHz measured by electromagnetic radiation shielding performance tester (TR-17301, product of Advantest Corporation)

⊚: ≧60 dB
○: <60 dB–≧50 dB
Δ: <50 dB–≧30 dB
X: <30 dB

The present invention provides the following advantageous effects:

(1) Pattern design is subject to little restriction.
(2) The degree of blackness and resolution of the black pattern on the transparent base material (first black layer) side are high and the opposite side (second black layer) is free of metallic glare, providing outstanding clarity. Long-term stability of these properties is excellent.
(3) An earth lead can be easily connected.
(4) Conductivity of metallic layer is high, particularly when formed of metallic foil, giving a high shielding effect, and high optical transmittance can be obtained since the aperture ratio can be set high. The long-term stability of these properties is excellent.
(5) The structure of a metallic layer sandwiched between black layers provides a protective effect that prevents degradation of metallic layer performance even under high-temperature, high-humidity conditions. Stable electromagnetic wave radiation shielding performance can therefore be obtained.
(6) The viewing angle is wide.
(7) Yield is good because the sheets to be laminated to transparent base plates can be cut to different sizes from a web (roll) of the transparent electromagnetic radiation shield film while avoiding inclusion of defective portions.
(8) Curved shields can also be produced.

What is claimed is:

1. A transparent electromagnetic radiation shield material comprising:
   a transparent base material,
   an optional transparent adhesive layer on the transparent base material, and
   a first black metallic oxide layer, a metallic layer and a second black metallic oxide layer of identical mesh pattern successively laminated in alignment on the transparent base material, directly or via the optional transparent adhesive layer,
   a portion of the second black metallic oxide layer being removed as required.

2. A transparent electromagnetic radiation shield material according to claim 1, wherein the mesh pattern is a grid pattern of lines of a width of 50 μm or less, intervals, i.e., opening widths, of less than 200 μm and a thickness of 50 μm or less.

* * * * *